(12) United States Patent
Thakur (10) Patent No.: US 6,255,159 B1
(45) Date of Patent: Jul. 3, 2001

(54) METHOD TO FORM HEMISPHERICAL GRAINED POLYSILICON

(75) Inventor: Randhir P. S. Thakur, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/892,188

(22) Filed: Jul. 14, 1997

(51) Int. Cl.$^7$ .............................................. H01L 21/8242

(52) U.S. Cl. .................. 438/253; 438/254; 438/255; 438/396; 438/397; 438/398

(58) Field of Search .................................. 438/255, 398, 438/253, 254, 396, 397, 964

(56) References Cited

U.S. PATENT DOCUMENTS

| | | | |
|---|---|---|---|
| 5,130,885 | 7/1992 | Fazan et al. | 361/313 |
| 5,278,091 | 1/1994 | Fazan et al. | 437/52 |
| 5,290,729 | 3/1994 | Hayashide et al. | 438/398 |
| 5,340,763 | 8/1994 | Dennison | 437/52 |
| 5,340,765 | 8/1994 | Dennison et al. | 437/52 |
| 5,407,534 | 4/1995 | Thakur | 156/662 |
| 5,418,180 | 5/1995 | Brown | 437/60 |
| 5,444,013 | 8/1995 | Akram et al. | 437/60 |
| 5,597,756 | 1/1997 | Fazan et al. | 437/52 |
| 5,608,247 | 3/1997 | Brown | 257/306 |
| 5,612,558 | 3/1997 | Harshfield | 257/298 |
| 5,629,223 | 5/1997 | Thakur | 438/398 |
| 5,634,974 | 6/1997 | Weimer et al. | 117/103 |
| 5,639,685 | 6/1997 | Zahurak et al. | 437/60 |
| 5,639,689 * | 6/1997 | Woo | 438/398 |
| 5,770,500 * | 6/1998 | Batra et al. | 438/255 |
| 5,913,119 * | 6/1999 | Lin et al. | 438/255 |
| 6,037,219 * | 3/2000 | Lin et al. | 438/255 |
| 6,046,083 * | 4/2000 | Lin et al. | 438/255 |

OTHER PUBLICATIONS

Mine, T., et al., "Capacitance–Enhanced Stacked–Capacitor with Engraved Storage Electrode for Deep Submicron DRAMs", 21rst Conf. on Solid State Devices and Materials, Tokyo, pp. 137–140, (1989).

Sakai, A., et al., "Crystallization of Amorphous Silicon with Clean Surfaces", *Japanese J. of Applied Physics,* 30, L. 941–L 943, (Jun. 1991).

Shinriki, H., et al., "Leakage Current Reduction and Reliability Improvement of Effective 3nm–Thick CVD Ta2O5 Film by Two–Step Annealing", 1989 Symp. on VLSI Technology, Digest of Technical Papers, Kyoto, 25–26, (May 22–25, 1989).

Watanabe, H., et al., "Hemispherical Grain Silicon for High Density DRAMs", *Solid State Technology,* 29–33, (Jul. 1992).

Watanabe, H., et al., "Hemispherical grained Si formation on in–situ phosphorus doped amorphous–Si electrode for 256Mb DRAM's capacitor", *IEEE Transactions on Electron Devices,* vol. 42, No. 7, pp. 1247–1253, (Jul. 1995).

\* cited by examiner

*Primary Examiner*—Carl Whitehead, Jr.
*Assistant Examiner*—Toniae M. Thomas
(74) *Attorney, Agent, or Firm*—Schwegman, Lundberg, Woessner & Kluth, P.A.

(57) ABSTRACT

A capacitor with Enhanced capacitance per cell area is provided. A container supported by a substrate is formed, followed by a first layer of undoped substantially amorphous silicon. Next, a layer of heavily doped amorphous silicon is formed on the first layer. A second layer of undoped amorphous silicon is formed on the doped layer. The layers are formed in a non-oxidizing ambient so that no oxide is formed between the layers. The structure formed is planarized to form separate containers made from the doped and undoped amorphous silicon layers. Any remaining oxide is then removed from the exterior sidewalls. Selected ones of the first and second undoped layers are seeded and annealed to convert the first and second layers to HSG. A dielectric layer and second electrode are formed to complete the cell capacitor.

38 Claims, 6 Drawing Sheets

METHOD TO FORM HEMISPHERICAL GRAINED POLYSILICON

FIELD OF THE INVENTION

The present invention relates to a method for fabricating integrated circuits, and in particular, to a method of manufacturing stacked capacitors for a dynamic random access memory (DRAM).

BACKGROUND OF THE INVENTION

Dynamic random access memories (DRAMs) are a widely used form of semiconductor memory. DRAMs are composed of a memory cell array and peripheral circuitry. Each memory cell array is formed of a plurality of memory cells for storing information. Typical memory cells are formed with a transistor for accessing a capacitor that stores charge. Of primary concern is maximizing the storage capacitance of each memory cell capacitor. This need is particularly acute in light of the demand for high density DRAMs, without increasing the chip area required to form the cell and, preferably, allowing a decrease in the chip area per cell.

One way to achieve greater capacitance per cell is to increase the surface area of the capacitor electrodes without increasing the respective cell area. As can be seen from the following equation, capacitance, C, is roughly determined by the thickness of the capacitor insulator ($t_{ox}$), the surface area of the capacitor electrodes (A), and the dielectric constant of the capacitor insulator (68).

$$C=(\epsilon \cdot A)/t_{ox}$$

Increasing the surface area of the capacitor electrodes by forming the storage capacitor in a container like shape is well known in the art. To further increase circuit density in DRAMs stacked capacitors are used. These capacitors are actually stacked on top of the substrate, which may or may not include access devices. Two or more layers of a conductive material called electrodes are formed of polysilicon or poly are deposited over the substrate with dielectric layers sandwiched between each electrode.

U.S. Pat. No. 5,340,765 to Dennison et al., herein incorporated by reference, describes a method for further increasing the capacitance of a bottom electrode of such capacitors by forming the electrode surfaces with hemispherical grained polysilicon (HSG) which increases the surface area of the electrodes. First, a portion of an oxide layer covering access circuitry on a semiconductor wafer is removed to form a container. A bottom electrode is then formed by growing a first amorphous silicon layer. A first insulating layer is then formed on the first amorphous silicon layer. Then, a doped silicon layer is formed on the first insulating layer. Subsequently a second insulating layer is formed on the doped silicon layer. Finally, a second amorphous silicon layer is formed on the second insulating layer.

The insulating layers may be formed of oxide or nitride, and freeze the grain boundaries during deposition of the layers. Both the first and second amorphous silicon layers, and the insulating layers are formed relatively thin in relation to the doped silicon layer.

After formation of the layers, the wafer is planarized and the oxide etched to form standing containers which are then annealed to form HSG on both sides of the doped silicon layer. The insulating layers keep the doped silicon layer intact such that the silicon atoms do not penetrate silicon interfacing layers. Formation of a dielectric layer and top capacitor plate complete the capacitor formation.

There is a need for an improved stacked capacitor which may be etched better. There is a further need for a stacked capacitor container with improved HSG formation and better migration of dopants during HSG formation. There is yet a further need to improve the formation of multiple layers of silicon in a stacked capacitor container. There is also a need to enhance the capacitance of stacked capacitors, and provide a capacitor with higher breakdown voltage which is less susceptible to charge depletion.

SUMMARY OF THE INVENTION

A capacitor for a dynamic random access memory (DRAM) is formed by depositing a first layer of undoped silicon supported by a substrate, followed by a heavily doped silicon layer and a second layer of undoped silicon. The depositions are performed to minimize or eliminate formation of oxide layers between the layers. Etch back of the oxide leaves a capacitor bottom electrode having a layer of doped silicon with a "painted" layer of undoped silicon. Hemispherical grained polysilicon (HSG) is then formed in the painted layers by seeding and annealing.

Enhanced capacitance per cell area is provided by this roughening of the surfaces of the bottom electrode of a capacitor. HSG formation is enhanced by forming it in initially undoped layers of silicon. By limiting the formation of oxide between the silicon layers, dopants from the middle, heavily doped layer freely migrate during the formation of the HSG in the painted layers without significantly adversely affecting the HSG formation.

Many different types of capacitors may be formed using the above method. If stacked capacitors are formed, a "pillar" of doped silicon with "painted" layers of undoped silicon on either side form side walls. Following a planarization and an etch step, HSG formation then occurs on all exposed sides of the pillar electrode. Formation of a trench capacitor is formed in much the same way, with layers of undoped silicon sandwiching a layer of doped silicon in a trench formed in the substrate. At least one of the layers of undoped silicon is then selectively converted to HSG after the layers have been subjected to lithography and etching.

When forming a stacked capacitor cell, a first layer of BSG, PSG or undoped oxide is formed to a desired depth with respect to the pillars of silicon. This layer provides support to the pillars, allowing taller, and hence larger capacitors structures to be built. The first layer may be followed by a nitride layer to provide an etch stop for a BPSG layer which if formed on top of the nitride layer.

In one embodiment, the formation of the bottom electrode of a capacitor cell is accomplished in a single wafer tool capable of the depositions and seeding and annealing steps. This provides a process that is more efficient and less costly then the prior art since wafers need not be moved between steps. The undoped silicon layers are formed in a low pressure hydrogen environment by flowing silane or disilane while maintain total pressure below 1 atmosphere so that the layers are relatively smooth and exhibit minimal trapping of oxides. Therefore, it is also an advantage of the present invention that the containers of the present invention can be more closely spaced than prior art methods since it is easier to remove such oxides from the undoped silicon layers.

During annealing, the dopants of the doped silicon layer freely migrate into the undoped layers to dope those layers. This provides a further benefit in that the fabricated capacitors are less susceptible to depletion than their prior art counterparts. Further features and advantages of the present invention, as well as the structure and operation of various

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims. Numbering in the Figures is usually done with the hundreds and thousands digits corresponding to the Figure number, with the exception that the same components may appear in multiple Figures. Scaling in the Figures does not represent precise dimensions of the structures illustrated.

Wafer and substrate are used interchangeably to refer to supporting semiconductor structures during processing. Both are to be understood as including silicon-on-sapphire (SOS) technology, silicon-on-insulator (SOI) technology, doped and undoped semiconductors, epitaxial layers of a silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined by the appended claims.

Figure 1A:
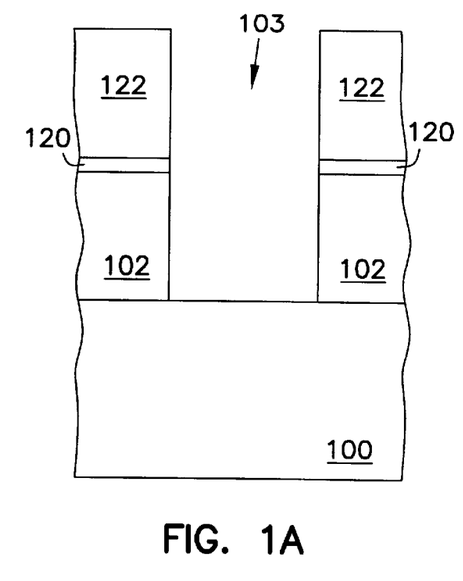
FIGS. 1A, 1B, 1C, 1D, 1E, 1F, 1G, 1H, 1I, and 1J are cross-sectional representations illustrating steps of forming a stacked capacitor in accordance with the present invention.

In FIG. 1A a multilayer insulative sidewall comprising a support layer 102 of undoped oxide, BSG, PSG or TEOS is formed on a substrate 100. The substrate 100 also contains other circuitry commonly used to form a dynamic random access memory (DRAM). The support layer 102 is followed by an etch stop layer 120 comprising nitride. The etch stop layer 120 is further followed by a BPSG layer 122, completing the multilayer sidewall. An opening 103 is etched in the sidewall. The opening may extend all the way to the substrate, and may expose active areas formed thereon, or may also be formed within the sidewall layer above the substrate, perhaps contacting circuitry formed in the sidewall layer. Alternatively, a plug is formed in the bottom of the container to contact desired active areas.

Figure 1B:
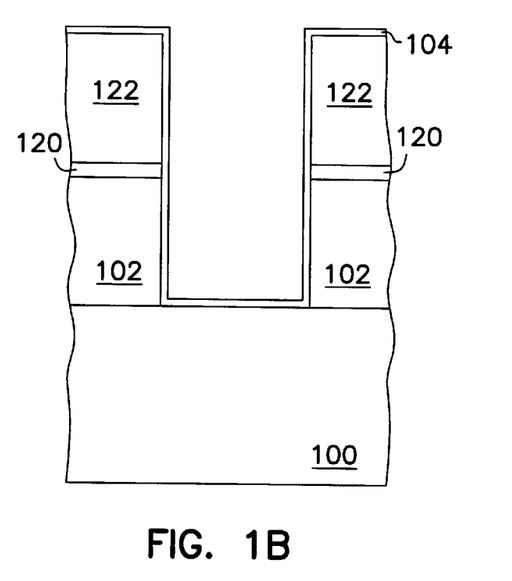
Figure 1C:
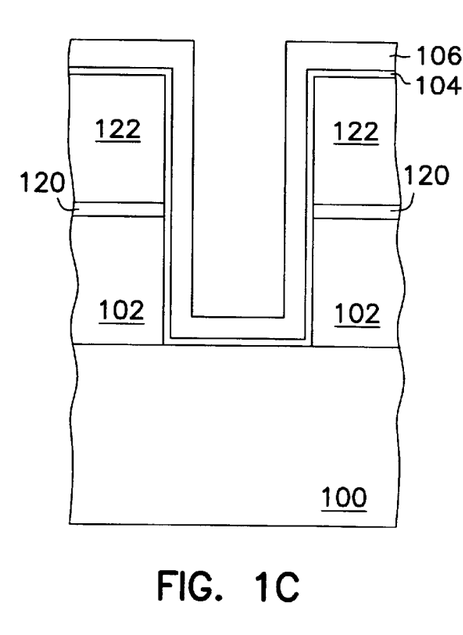

Following formation of the opening 103, a first layer of undoped or substantially undoped amorphous polysilicon 104 having a thickness approximately between 40 and 200 angstroms is formed over the insulative layer, as shown in FIG. 1B. Typically, the undoped amorphous polysilicon 104 is formed at temperatures between approximately 450 and 525 degrees Celsius. Because it is formed at a low pressure of 1 atmosphere or below, such as within a range of approximately $10^{-3}$ to $10^{-1}$ Torr in hydrogen or other inert ambient having a base pressure of approximately $10^{-8}$ Torr, but within a range of approximately $10^{-8}$ to $10^{-1}$ Torr, the undoped amorphous polysilicon 104 is formed with a relatively low surface roughness. Subsequently, a heavily doped n+ amorphous silicon layer 106 having a thickness between 100 and 1000 angstroms is deposited on the first undoped layer 104, as shown in FIG. 1C. The layer 106 may be n or p doped. Common dopants for layer 106 comprise n or p-type dopants such as arsenic, phosphorous or boron. The doped layer 106 is formed at a temperature between approximately 450 and 600 degrees Celsius with a doping level between $5 \times 10^{20}$ and $5 \times 10^{21}$ $cm^{-3}$ at a pressure range of approximately $10^{-8}$ to $10^{-1}$ Torr.

Figure 1D:
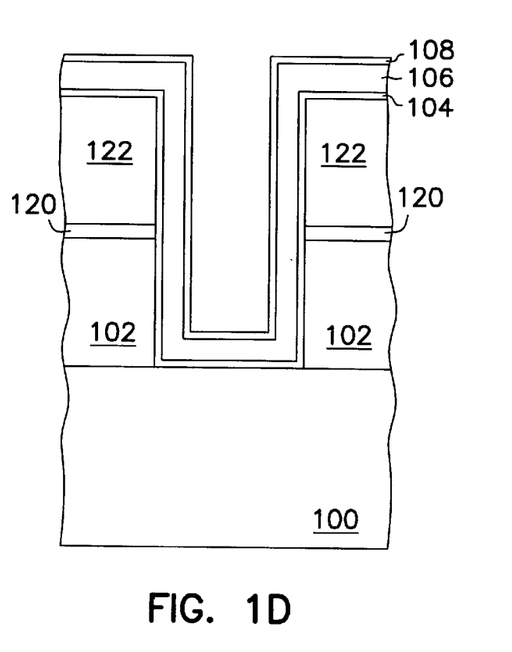

The heavily doped layer 106 is followed by a second layer of undoped or substantially undoped amorphous polysilicon 108, which is formed on the doped amorphous silicon layer 106 under similar conditions and using the same or similar parameters as used when forming first undoped layer 104, as shown in FIG. 1D. The substantially undoped layers 104, 108 provide good nucleation sites for subsequent seeding used to form hemispherical grained polysilicon (HSG). The layers are substantially amorphous to aid in the formation of HSG, but need not be completely amorphous. The silicon layers 104, 106, and 108 are typically formed with silane or disilane. However, organo- and other hydride precursors can be used instead. Processing is performed in a hydrogen atmosphere to prevent an undesirable insulating layer, of oxide for example, from forming on or between the silicon layers during formation. The silicon layers are formed in a single wafer tool so that ambients can be changed quickly, which helps prevent oxidation between layers. Batch and batch cluster tools may also be used.

Figure 1E:
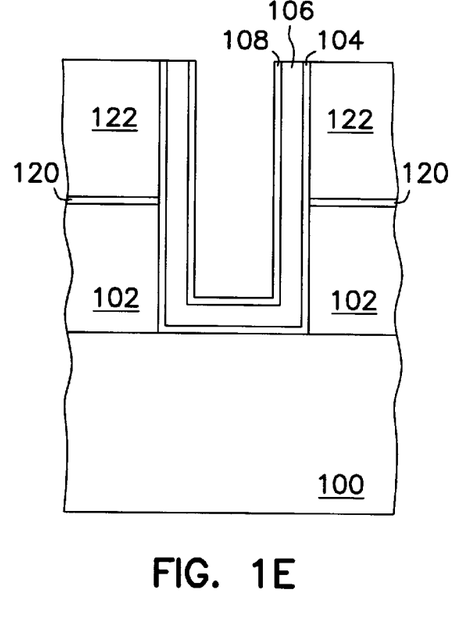

Next, the wafer is planarized, such as by chemical mechanical planarization for example, to remove undesired lateral portions of the deposited silicon layers 104, 106, 108, as shown in FIG. 1E. Subsequently, BPSG layer 122 is removed as by etching to expose the exterior sidewalls of the bottom electrode in the shape of a container 110 in FIG. 1F. Layer 122 should have good etch selectivity with respect to etch stop 120, which is formed of nitride or other desired dielectric material that functions as an etch stop. Optionally, layer 122 has sufficient etch selectivity with respect to support layer 102 such that no separate etch stop layer is required. By modifying the thicknesses of these sidewall layers 102, 120 and 122, the amount of support provided to the resulting container can be varied as desired. Such a multilayer insulator may also be used to provide support to other capacitor containers formed in different manners.

Figure 1F:
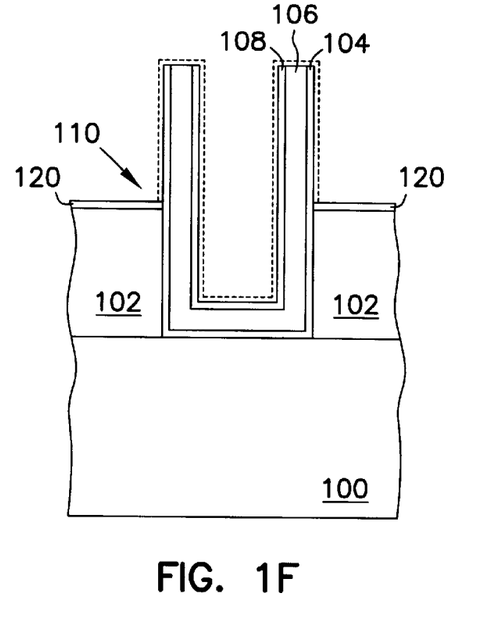

The sides of the resulting container comprise pillars of doped silicon 106 surrounded by layers of "paint" comprising undoped silicon layers 104 and 108. Because the first amorphous silicon layer 104 has a relatively low surface roughness, most of the insulator layer 102 is removed. Thus, capacitors can be separated by a pitch of less than two tenths of the diameter of a container, such as 0.18 microns in current high density DRAMS.

Figure 1G:
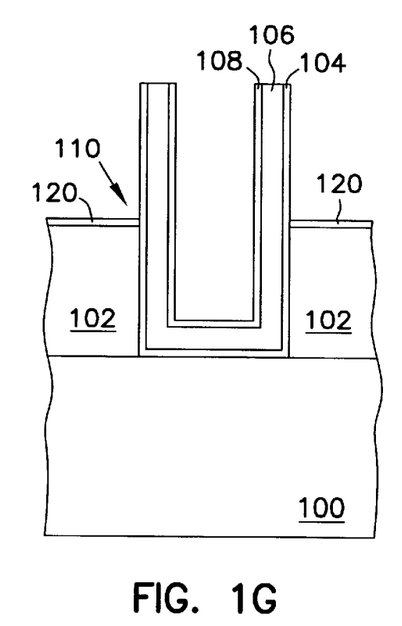

At this point, a native oxide remains on the exterior exposed pillars as indicated at 112 in FIG. 1F. The native oxide is selectively removed by lithography and wet or dry etching, such as with a combination of hydrofluoric acid, chlorine, and ultraviolet light as represented in FIG. 1G.

Removal of the native oxide promotes enhanced HSG formation in the next step.

Figure 1H:
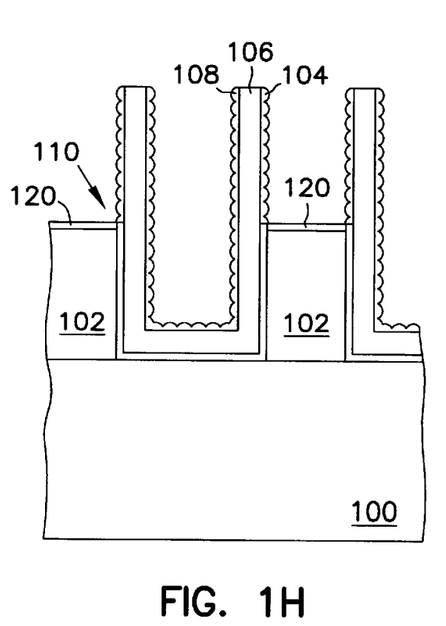

To selectively create HSG, the thin, smooth, amorphous silicon layers 104 and 108 are then seeded with a chemical species where they are exposed, such as germanium, silicon, or titanium, in combination with silane or disilane at different partial pressures. Germanium seeding is provided at approximately greater than 1%, in an approximate range of 1 to 30%. The seeding is performed in a rapid thermal or low pressure chemical vapor deposition tool. The silane or disilane is added at a rate of between 10 and 100 sscm at a pressure of between 10 and 20 milliTorr. The species are added at a pressure of one atmosphere or less. Subsequently, the DRAM 100 is annealed to convert the undoped layers 104, 108 into HSG as indicated in FIG. 1H. The anneal is performed at a temperature in the range of approximately 450 to 700 degrees C., sufficient to cause at least partial migration of dopants to undoped layers. The resulting structure comprises pillars of doped silicon surrounded by layers of HSG having dopants which have migrated from the doped pillars. In one embodiment, layer 106 is n doped, and may also be seeded with germanium.

Modification of the thicknesses of the sidewall layers 102, 120 and 122 can also be used to vary the total surface area of the pillars that is converted into HSG, allowing fine control of resulting capacitance. By modifying the height of support layer 102, portions of layer 104 adjacent layer 102 will not be seeded, and hence not converted to HSG. Simply by modifying the thickness, both the amount of support provided to the pillars, and the amount of surface area converted to HSG are controlled.

Figure 1I:
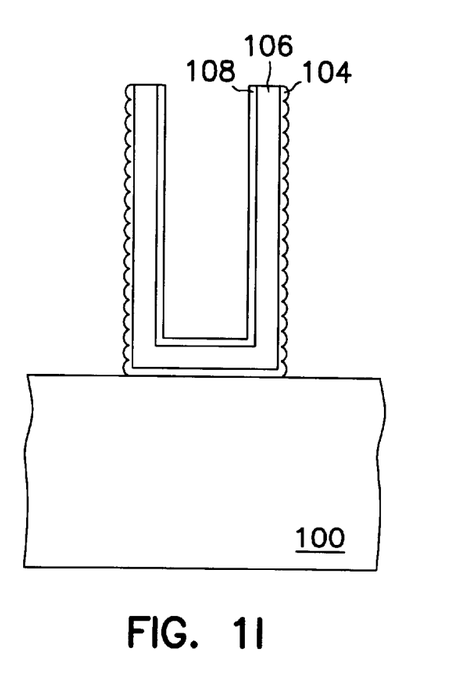
Figure 1J:
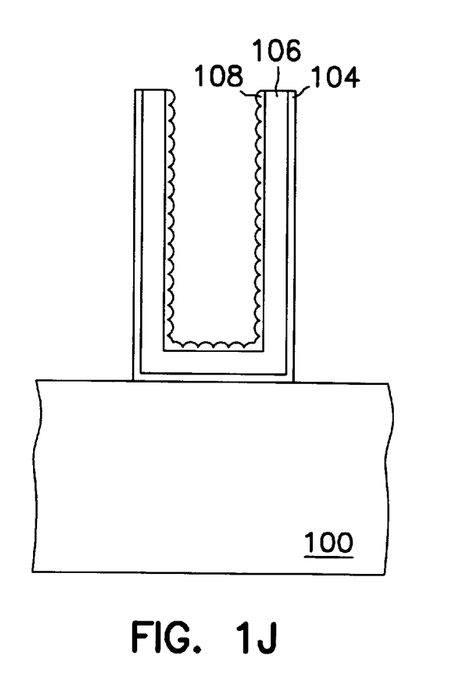

There are several alternative embodiments which result from selective HSG formation. In a first alternate embodiment, native oxide is only removed from layer 104 prior to the step of forming HSG as described above. This will result in a multilayer structure as seen in FIG. 1I where layer 104 comprises HSG, and the remaining layers remain relatively unchanged by the seeding an annealing during HSG formation. In a second alternative illustrated in FIG. 1J, only layer 108 is selectively converted to HSG in the same manner as layer 104 by only removing oxide from layer 108 prior to seeding and annealing by use of standard lithography and etching. By further annealing, both the layer 106 and 108 may be converted to HSG if desired. In yet a further alternative embodiment, the undoped layer 108 is directly deposited as HSG in a known manner following formation of layers 104 and 106. This may be followed by seeding and annealing of layer 104 if desired following removal of native oxides. The structures shown in FIGS. 1I and 1J may also be selectively partially supported by an insulative support layer as described above. In a yet further alternative embodiment, the layer 106 may be formed from a selective Si—Ge film for the bottom electrode. That layer may be seeded with Ge and then annealed to convert it to HSG.

Figure 2:
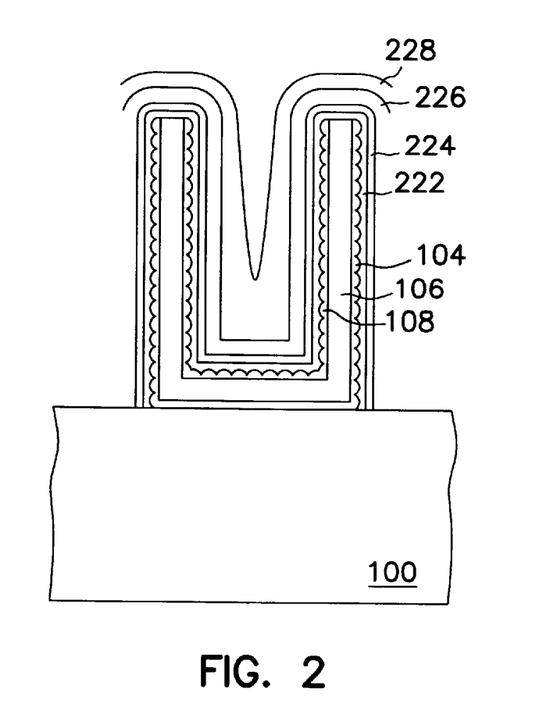
FIG. 2 is a cross-sectional representation of a fully formed stacked capacitor in accordance with the present invention.

Finally, as shown in FIG. 2, a rapid thermal nitridation indicated at 222 is followed by formation of a capacitor dielectric 224, which may be nitride or tantalum pentoxide ($Ta_2O_5$), nitride, BST, or any of many well known dielectrics, is formed generally conformally over the electrodes using the same single wafer tool or cluster of wafer tools. A top electrode conductor 226 comprising tungsten nitride (WN), titanium nitride (TiN) or other commonly used conductive electrode, including refractory metal silicides and nitrides or Si—Ge coating on HSG, is then formed over the dielectric layer 224. Finally, a doped generally conformal poly layer 226 is formed over the top electrode, which serves as a common capacitor cell plate to an entire array of finished containers 214. Successive processing steps to complete capacitor and DRAM formation may the be performed, and are known to persons skilled in the art. A DRAM may have in excess of 64 million of such containers, each corresponding to one bit to be stored. In addition, there are many spare cells used as replacements. The present invention allows closer spacing of the cells, which results in great space savings and higher density DRAMs.

The formation of the bottom electrode, and the rest of the capacitor is performed in one or more tools for processing a single wafer or a batch of multiple wafers. If only one tool is used, it is preferred that it have heating and gas flowing capabilities, like a rapid thermal chemical vapor deposition (RTCVD) reactor. One such tool suitable for use is an Integra, manufactured by AGI, Inc. Many other common tools, such as low pressure chemical vapor deposition (LPCVD) reactors will also work. Because the bottom electrode of the present invention can be formed in a single tool, DRAM manufacturing efficiency is increased and production costs are reduced.

Figure 3:
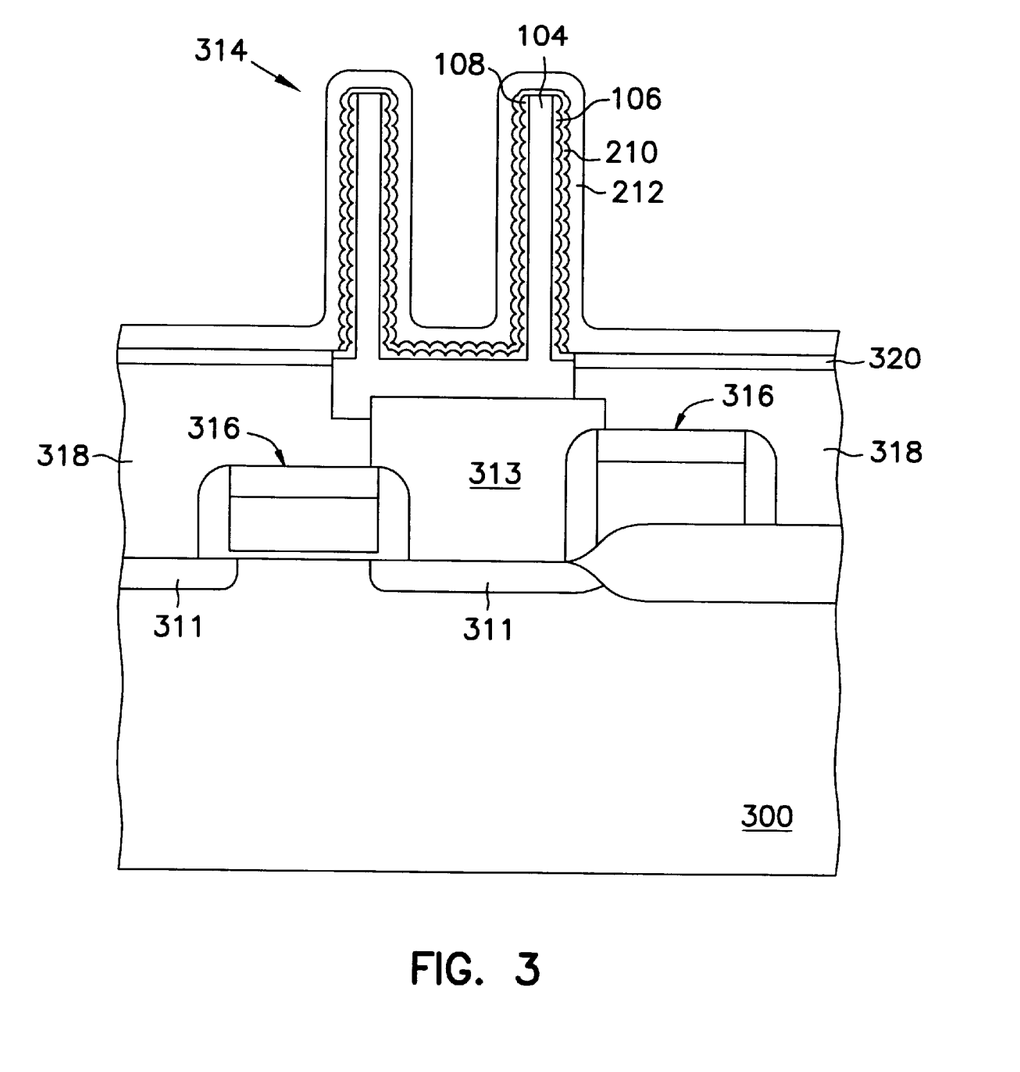
FIG. 3 is a cross-sectional representation of a fully formed stacked capacitor formed on top of access circuitry in accordance with the present invention.

In FIG. 3, a container 314 is shown formed on top of other circuitry on a wafer 300. Layer 106 is coupled to an active area 311 via a poly plug 313. Other circuitry comprises word lines 316 formed in an oxide layer 318. A nitride layer 320 was used as an etch stop for formation of the opening in which container 314 was formed. Alternatively, TEOS can be used as an etch stop with BPSG being the material etched for form the container. This illustrates the versatility of the formation of stacked capacitors using the method described in the present invention. The ability to form the capacitors anywhere on top of the substrate allows for even denser circuitry in DRAM devices.

Figure 4A:
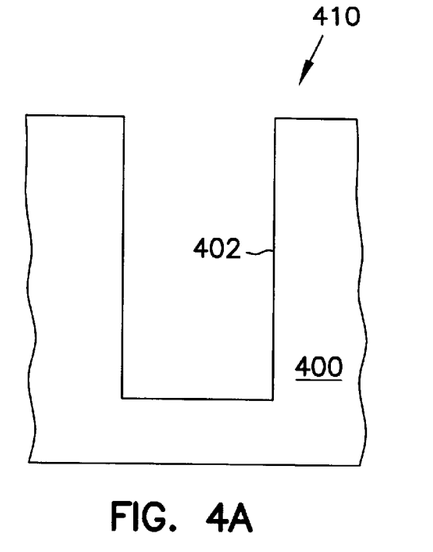
FIGS. 4A, 4B, 4C, 4D, 4E, and 4F are cross-sectional representations illustrating steps of forming a trench capacitor in accordance with the present invention.
Figure 4B:
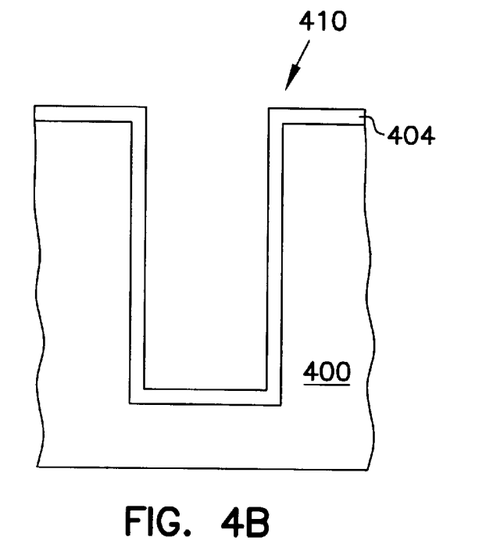
Figure 4C:
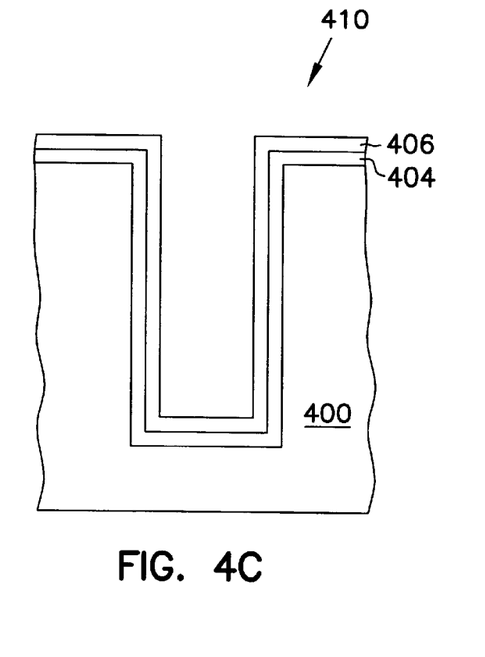

In FIGS. 4A, 4B, 4C, 4D, 4E, and 4F, a trench capacitor indicated generally at 410 is formed using concepts and process flow similar to those used in forming the stacked capacitor of FIGS. 1A–1H. A trench 402 is first formed in a substrate 400. As previously mentioned, the substrate may also comprise silicon or other semiconductor material formed on an insulator. The trench may be patterned using a trench mask, and formed in a well known manner. Next, a layer of undoped amorphous polysilicon 404 having a thickness approximately between 40 and 200 angstroms is formed in FIG. 4B such as by common deposition techniques on surfaces of the trench 402. Typically, the undoped amorphous polysilicon 404 is formed at temperatures between approximately 450 and 525 degrees Celsius. Because it is formed at a low pressure of 1 atmosphere or below, such as within a range of approximately $10^{-3}$ to $10^{-1}$ Torr in hydrogen or other inert ambient having a base pressure of approximately $10^{-8}$ Torr, but within a range of approximately $10^{-8}$ to $10^{-1}$ Torr, the undoped amorphous polysilicon 104 is formed with a relatively low surface roughness. Subsequently, a heavily doped amorphous silicon layer 406 having a thickness between 100 and 1000 angstroms is deposited on the first undoped layer 404, as shown in FIG. 4C. Common dopants comprise p or n-type dopants such as arsenic, phosphorous or boron. The doped layer 406 is formed at a temperature between approximately 450 and 600 degrees Celsius with a doping level between $5 \times 10^{20}$ and $5 \times 10^{21}$ $cm^{-3}$ at a pressure range of approximately $10^{-8}$ to $10^{-1}$ Torr.

Figure 4D:
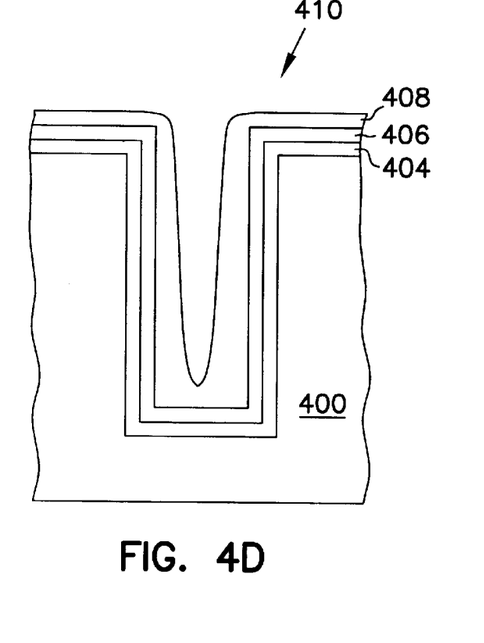

The heavily doped layer 406 is followed by a second layer of undoped amorphous polysilicon 408 in FIG. 4D, which is formed on the doped amorphous silicon layer 406 under similar conditions and using the same or similar parameters as used when forming first undoped layer 404. The undoped layer 408 provides a good nucleation site for subsequent seeding used to form hemispherical grained polysilicon (HSG). The silicon layers 404, 406, 408 are typically formed with silane or disilane. However, organo- and other hydride precursors can be used instead. Processing is performed in a hydrogen atmosphere to prevent an undesirable insulating layer, of oxide for example, from forming on or between the silicon layers during formation.

Figure 4E:
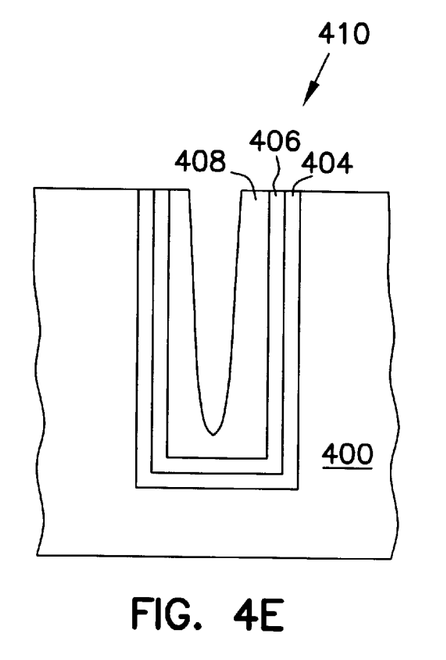

Next, undesired lateral portions of the deposited silicon layers 404, 406, 408 are removed by standard planarization techniques in FIG. 4E. At this point, a native oxide remains on exposed sidewalls of the trench capacitor. The native oxide is removed by wet or dry etching, such as with a combination of hydrofluoric acid, chlorine, and ultraviolet light as also represented in FIG. 4E. Removal of the native oxide promotes enhanced HSG formation in the next step.

To create HSG, the thin, smooth, amorphous silicon layer 408 is seeded with a chemical species, such as germanium, silicon, or titanium, in combination with silane or disilane at different partial pressures. The seeding is performed in a rapid thermal or low pressure chemical vapor deposition tool. The silane or disilane is added at a rate of between 10 and 100 sscm at a pressure of between 10 and 20 milliTorr. The species are added at a pressure of one atmosphere or less. Subsequently, an anneal is performed to convert the undoped layer 408 into HSG and complete formation of a bottom capacitor electrode. The anneal is performed at a temperature in the range of approximately 450 to 700 degrees C., sufficient to cause dopants to at least partially migrate to undoped layers.

Figure 4F:
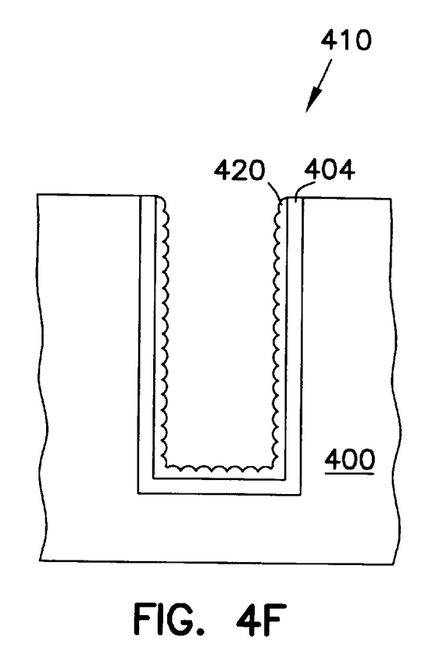

In one embodiment, the layer 408 is formed by directly depositing HSG in a known manner. In further embodiments, various of the layers may be converted to HSG by varying the time of anneal, such as converting both layers 408 and 406 to HSG. Layer 404 may also be converted to HSG if desired, or may be omitted altogether in a trench capacitor.

Finally, a capacitor dielectric, which may be nitride or tantalum pentoxide or any of many well known dielectrics, is formed generally conformally over the bottom electrode using the same single wafer tool or cluster of wafer tools. A doped generally conformal poly layer is then formed over the cell dielectric and serves as a common capacitor cell plate to an entire array of finished trenched capacitors. Successive processing steps to complete capacitor and DRAM formation may then be performed, and are known to persons skilled in the art.

It is to be understood that the above description is intended to be illustrative, and not restrictive. Many other embodiments will be apparent to those of skill in the art upon reviewing the above description. For example, the shape of the storage electrode may be a plain cubic structure, a cylindrical structure, a fin-type structure, or a stacked trench type structure. Furthermore, the present invention describes the formation of a three-dimensional container for a bottom electrode of a stacked capacitor. However, other electrode structures, including a ministack, and honeycomb, known to those skilled in the art, can be formed in a similar manner. Still further, the method of forming the capacitors may be used in memory devices other than DRAMs. In fact, it may be used to produce capacitors used in general circuitry, and not for storage of data. Selective Si—Ge films can also be deposited, followed by Ge seeding and annealing to form HSG. Nitride and tantalum films or BST dielectric films can then be deposited on top to form the dielectric. The scope of the invention should, therefore, be determined with reference to the appended claims, along with the fill scope of equivalents to which such claims are entitled.

What is claimed is:

1. A method for forming at least a portion of a capacitor in an opening in an insulative layer supported by a substrate, the opening having walls and a bottom, the method comprising the steps of:

forming a layer of substantially undoped amorphous silicon in the opening;

forming a layer of heavily doped silicon on the layer of substantially undoped amorphous silicon;

forming another layer of substantially undoped amorphous silicon on the heavily doped layer of silicon;

removing selected portions of the insulative layer to expose pillars comprising portions of the silicon layers formed on the walls of the opening;

removing oxide from the pillars;

seeding the undoped amorphous silicon layers; and annealing the silicon layers to convert the undoped amorphous silicon layers to HSG.

2. The method of claim 1, wherein the undoped amorphous silicon layers each have a thickness between 40 and 200 angstroms.

3. The method of claim 1, wherein the undoped amorphous silicon layers are formed at a temperature between 450 and 525 degrees Celsius.

4. The method of claim 1, wherein the heavily doped amorphous polysilicon layer is formed at a temperature between 450 and 600 degrees Celsius.

5. The method of claim 1, wherein the heavily doped amorphous polysilicon layer is formed with a doping level between $5 \times 10^{20}$ and $5 \times 10^{21}$ cm$^{-3}$.

6. The method of claim 1, wherein the oxide is removed using hydrofluoric acid, chlorine and ultraviolet light.

7. A method for forming at least a portion of a capacitor in an opening in an insulative layer supported by a substrate, the opening having walls and a bottom, the method comprising the steps of:

forming a layer of substantially undoped amorphous silicon in the opening;

forming a layer of heavily doped silicon on the layer of substantially undoped amorphous silicon in a single processing tool in an ambient not containing significant amounts of oxygen;

forming another layer of substantially undoped amorphous silicon on the heavily doped layer of silicon in a single processing tool in an ambient not containing significant amounts of oxygen;

removing selected portions of the insulative layer to expose pillars comprising portions of the silicon layers formed on the walls of the opening;

seeding the undoped amorphous silicon layers; and annealing the silicon layers to convert the undoped amorphous silicon layers to HSG.

8. A method for forming at least a portion of a capacitor in an opening in an insulative layer supported by a substrate, the opening having walls and a bottom, the method comprising the steps of:

forming a layer of substantially undoped amorphous silicon in the opening in a hydrogen ambient;

forming a layer of heavily doped silicon on the layer of substantially undoped amorphous silicon in a hydrogen ambient;

forming another layer of substantially undoped amorphous silicon on the heavily doped layer of silicon in a hydrogen ambient;

removing selected portions of the insulative layer to expose pillars comprising portions of the silicon layers formed on the walls of the opening;

seeding the undoped amorphous silicon layers; and annealing the silicon layers to convert the undoped amorphous silicon layers to HSG.

9. A method for forming at least a portion of a stacked capacitor in an opening in an insulative layer supported by a substrate, the method comprising the steps of:

forming a bottom electrode container comprising pillars of heavily doped silicon sandwiched by layers of substantially undoped amorphous silicon with no oxide layers formed between the layers; and converting the layers of substantially undoped amorphous silicon to HSG.

10. The method of claim 9, wherein the layers of undoped silicon each have a thickness between 40 and 200 angstroms.

11. The method of claim 9, wherein the layers of undoped silicon are formed at a temperature between 450 and 525 degrees Celsius.

12. The method of claim 9, wherein the doped silicon layer is formed at a temperature between 450 and 600 degrees Celsius.

13. The method of claim 9, wherein the doped silicon layer is formed with a doping level between $5 \times 10^{20}$ and $5 \times 10^{21}$ cm$^{-3}$.

14. The method of claim 9, and further comprising the step of removing oxide from the pillars prior to the annealing step.

15. The method of claim 14 wherein the oxide is removed using hydrofluoric acid, chlorine and ultraviolet light.

16. The method of claim 9, wherein the converting step comprises the steps of seeding at least one of the undoped silicon layers with silane at a pressure of between 10 and 20 milliTorr and annealing the bottom electrode.

17. The method of claim 9, wherein the silicon layers are formed in a single processing tool in an ambient not containing significant amounts of oxygen.

18. The method of claim 17, wherein the steps of forming silicon layers are performed in a hydrogen ambient.

19. A method for forming a bottom electrode of a capacitor supported by a substrate, the method comprising the steps of:

forming a bottom electrode container comprising pillars of heavily doped silicon sandwiched by layers of substantially undoped amorphous silicon with no oxide layers formed between the layers; and converting at least one of the layers of silicon to HSG.

20. The method of claim 19, wherein at least one of the layers of undoped silicon has a thickness between 40 and 200 angstroms and is formed at a temperature between 450 and 525 degrees Celsius.

21. The method of claim 19, wherein the doped silicon layer is formed at a temperature between 450 and 600 degrees Celsius with a doping level between $5 \times 10^{20}$ and $5 \times 10^{21}$ cm$^{-3}$.

22. The method of claim 19, and further comprising the step of removing oxide from at least on of the layers of undoped silicon prior to the annealing step using hydrofluoric acid, chlorine and ultraviolet light.

23. The method of claim 19, wherein the converting step comprises the steps of seeding at least one of the undoped silicon layers with silane at a pressure of between 10 and 20 milliTorr and annealing the bottom electrode.

24. The method of claim 19, wherein the silicon layers are formed in a single processing tool in a hydrogen ambient not containing significant amounts of oxygen.

25. The method of claim 19, wherein the step of converting comprises the steps of seeding at least one of the undoped silicon layers with germanium at between approximately 1 to 30% and annealing the bottom electrode.

26. The method of claim 19, wherein the pillars of heavily doped silicon are n+ doped.

27. The method of claim 26, and further comprising the step of seeding the pillars of heavily doped silicon with germanium.

28. A method for forming a capacitor in an insulative layer supported by a substrate, the method comprising the steps of:

removing a first portion of the insulator layer to form an opening;

forming a first layer of undoped amorphous silicon on the insulative layer;

forming a layer of doped amorphous silicon on the first layer of silicon;

forming a second layer of undoped amorphous silicon on the doped layer of silicon, wherein each of the layers of silicon are formed in an ambient substantially devoid of oxygen so that no oxide layers are formed between the silicon layers;

planarizing the dielectric layer to form a container comprising pillars of doped silicon painted with the layers of undoped amorphous silicon;

removing selected portions of the insulative layer to expose exterior sidewalls of the containers;

removing an oxide from the exterior sidewalls;

seeding the first and second layers; and annealing the silicon layers to convert the first and second layers to HSG.

29. The method of claim 28, wherein the insulative layer comprises two layers having good etch selectivity.

30. A method for forming a stacked capacitor in an insulative layer supported by a substrate, the method comprising the steps of:

removing a first portion of the insulator layer to form an opening;

forming a first layer of undoped amorphous silicon at a temperature between 450 and 525 degrees Celsius on the insulative layer, the first layer having a thickness between 40 and 200 angstroms;

forming a layer of doped amorphous silicon on the first layer of silicon, the layer of doped amorphous silicon being formed at a temperature between 450 and 600 degrees Celsius with a doping level between $5 \times 10^{20}$ and $5 \times 10^{21}$ cm$^{-3}$;

forming a second layer of undoped amorphous silicon at a temperature between 450 and 525 degrees Celsius, the second layer having a thickness between 40 and 200 angstroms on the doped layer of silicon, wherein each of the layers of silicon are formed in an ambient substantially devoid of oxygen so that no oxide layers are formed between the silicon layers;

planarizing the dielectric layer to form a container comprising pillars of doped silicon painted with the layers of undoped amorphous silicon;

removing a second portion of the insulative layer to expose exterior sidewalls of the containers;

removing an oxide from the exterior sidewalls;

seeding the first and second layers with silane at a pressure of between 10 and 20 milliTorr; and annealing the silicon layers to convert the first and second layers to HSG.

31. A method for forming at least a portion of a capacitor supported by a substrate, the method comprising the steps of:

forming a bottom electrode container comprising pillars of heavily doped silicon sandwiched by layers of substantially undoped amorphous silicon with no oxide layers formed between the layers; and converting at least one selected layer of substantially undoped amorphous silicon to HSG.

32. The method of claim 31 wherein one selected layer of substantially undoped amorphous silicon and the pillars are converted to HSG.

33. A method for forming at least a portion of a trench capacitor supported by a substrate, the method comprising the steps of:

forming a trench in the substrate;

forming a bottom electrode container in the trench comprising pillars of heavily doped silicon sandwiched by layers of substantially undoped amorphous silicon with no oxide layers formed between the layers; and converting at least one selected layer of substantially undoped amorphous silicon to HSG.

34. A method for forming a capacitor supported by a substrate, the method comprising the steps of:

forming a bottom electrode container comprising pillars of heavily doped silicon sandwiched by layers of substantially undoped amorphous silicon with no oxide layers formed between the layers;

converting selected layers of substantially undoped amorphous silicon to HSG;

forming a dielectric layer on top of the HSG; and forming a top electrode on top of the dielectric layer.

35. The method of claim 34 wherein the dielectric layer comprises a dielectric selected from the group consisting of $Ta_2O_5$, BST and nitride.

36. The method of claim 34 wherein the top electrode comprises a conductor selected from the group consisting of refractory metal silicides and nitrides.

37. The method of claim 34 wherein the top electrode comprises a conductor selected from the group consisting of WN, TiN and conductive refractory metal silicides and nitrides.

38. A method for forming a bottom electrode of a capacitor supported by a substrate, the method comprising the steps of:

forming a bottom electrode container comprising a Si—Ge film;

seeding the Si—Ge film with Ge; and annealing the bottom electrode to convert the Si—Ge film to HSG.

* * * * *